United States Patent [19]

Baba

[11] Patent Number: 4,831,498

[45] Date of Patent: May 16, 1989

[54] SHIELD STRUCTURE FOR CIRCUIT ON CIRCUIT BOARD

[75] Inventor: Yoshihiko Baba, Noda, Japan

[73] Assignee: Uniden Corporation, Ichikawa, Japan

[21] Appl. No.: 135,265

[22] Filed: Dec. 21, 1987

[30] Foreign Application Priority Data

Jul. 23, 1987 [JP] Japan ................. 62-182188

[51] Int. Cl.⁴ .............................................. H05K 9/00
[52] U.S. Cl. .............................. 361/424; 174/35 GC; 361/399
[58] Field of Search ................... 174/35 R, 35 GC, 51; 361/397, 398, 395, 399, 400, 424

[56] References Cited

U.S. PATENT DOCUMENTS

| | | | |
|---|---|---|---|
| 2,604,507 | 7/1952 | Tyson | 174/35 GC |
| 3,296,356 | 1/1967 | McAdams | 174/35 GC |
| 4,138,711 | 2/1979 | Bremenour | 361/424 |
| 4,384,165 | 5/1983 | Loving, Jr. | 174/35 GC |
| 4,464,544 | 8/1984 | Klein | 361/424 |
| 4,658,334 | 4/1987 | McSparran | 174/35 R |

Primary Examiner—Gerald P. Tolin
Attorney, Agent, or Firm—Oblon, Fisher, Spivak, McClelland & Maier

[57] ABSTRACT

A shielding structure for a circuit on a circuit board has a conductive box member for enclosing a region of the surface of the circuit board requiring shielding. The edge defining the open side of the conductive box member has a conductive rib protruding therefrom. A conductive pattern member is formed on the surface of the circuit board in the same shape as the edge of the conductive box member so as to encircle the region requiring shielding. The conductive box member is fastened on the circuit board by screws so as to cause the conductive rib to bite into the conductive pattern member and establish good electrical connection therewith. A conductive sheet can be inserted between the conductive box member and the conductive pattern member to further enhance the shielding effect.

1 Claim, 9 Drawing Sheets

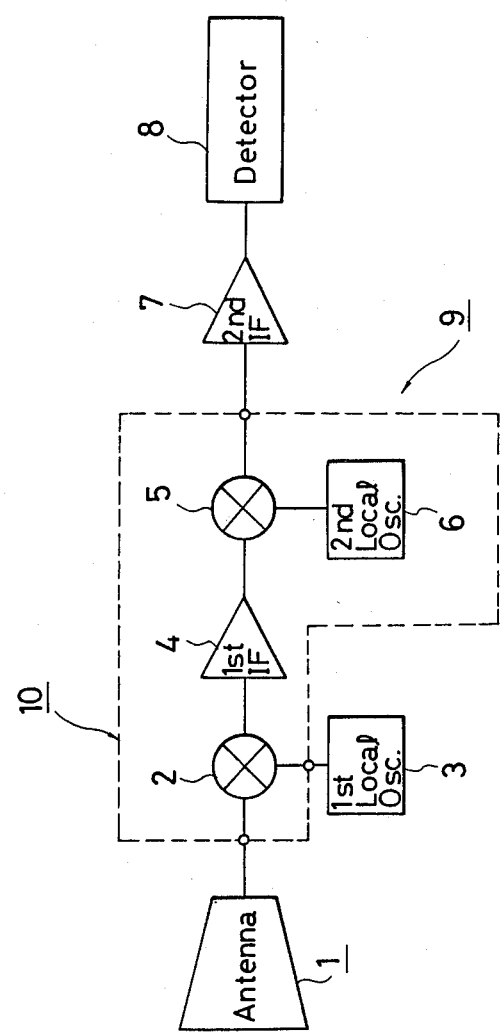
FIG.I

SHIELD STRUCTURE FOR CIRCUIT ON CIRCUIT BOARD

BACKGROUND OF THE INVENTION

1. Field of the Invention

This invention relates to a shield structure for shielding various kinds of electronic circuits and more particularly to an improved shield structure for providing effective electromagnetic shielding for a prescribed region of a circuit board having circuit elements mounted thereon.

2. Prior Art Statement

For the purpose of realizing an electronic circuit with specific desired functions, it has become an extremely commonplace technique to mount various electronic components on an appropriate circuit board, typically a printed circuit board, and to electrically interconnect the components by a network of conductive lines which may, for example, be printed wires.

It has also become an ordinary practice to enclose both the electronic circuit constituted in this way and the circuit board on which it is mounted within an appropriate housing of, or lined with, a conductive material, in this way making the circuit resistant to external electromagnetic interference. There are, however, cases in which it becomes desirable to provide further electromagnetic shielding for specific, limited regions on the surface of the circuit board.

While there are any number of cases in which this type of electromagnetic shielding is required, there will be taken up as an easy-to-understand example the radar detector produced by the present inventor.

Radar detectors are in particularly wide use in the United States. When the radar detectors detects an X-band or K-band microwave signal (what is generally referred to as a "radar wave"), such as transmitted by the police for enforcement of vehicle speed regulations, it produces a warning sound or causes a lamp to go on or off. Typically such radar detectors are of the double conversion type and comprise a circuit block of the general type shown for a radar detector 9 in FIG. 1.

The radar wave is received by a horn antenna 1 and the output from the antenna 1 is applied to a first mixer 2 which also receives a first local oscillator frequency produced by a first local oscillator 3. The output of the first mixer 2 is sent through a first intermediate frequency (IF) amplifier 4 to a second mixer 5 which receives a second local oscillator frequency produced by a second local oscillator 6, and the output from the second mixer 5 is forwarded through a second IF amplifier 7. After the signal has been converted to a fixed second intermediate frequency in this way, it is applied to a discriminator or detector 8.

As regards the specific frequencies employed in the circuit of this structure, the center frequency of the X-band is 10.525 GHz and that of the K-band is 24.150 GHz, and in either case a band width of ±100 MHz relative to the center frequency is permissible.

For enabling the radar detector 9 shown in FIG. 1 to detect both X-band and K-band signals, it is known to employ the harmonic mixing system in which a basic frequency of, for example, 11.558 GHz is used as the first local oscillator frequency.

More specifically, in the case of the X band the beat frequency with the basic frequency is extracted from the first mixer 2, and in the case of the K band the beat frequency with the second harmonic of the basic frequency (11.558×2=23.116 GHz) is extracted from the first mixer 2. Thus, in either case, an intermediate frequency of 1,033±100 MHz is output by the first IF amplifier 4.

This intermediate frequency is further beat down in the solid state second mixer 5 so as to convert it to a signal with a frequency of several tens of megahertz, which is applied to the signal detector 8. When the signal detector 8 detects a signal with a frequency on the aforesaid order, it drives an appropriate sound generating means or visual display means (neither shown), in this way producing a warning.

The biggest problem encountered in a circuit system of this type is that of the interference of external noise with the circuit signals. The effect of such noise is particularly large on the portion of the circuitry that handles the first intermedaite frequency, because the first IF amplifier is generally constituted as a low-noise, high-gain amplifier. Such noise may well cause erroneous detection by the final signal detector 8.

Another problem is that the 1,033±100 MHz band used as the IF frequency in the radar detector 9 is also used as a communications carrier frequency by other types of communication circuit systems and the like. As a result, radar detectors of this type are frequently subject to interference from such communications equipment.

In view of this situation, those portions of the circuit that are easily or strongly affected by such interference (specifically, the first mixer 2, the first IF amplifier 4, the second mixer 5 and the second local oscillator 6) have been designated as a "shield-requiring region" 10, and this region 10 has been provided with a special shield in addition to the overall shield provided for the radar detector as a whole.

When, as in the foregoing example, it is found necessary to designate a certain portion of the circuitry on a circuit board as a shield-requiring region, the most common method used for providing the special shield has been as will now be explained with reference to FIG. 2(A).

In FIG. 2(A), reference numeral 11 designates a circuit board, typically a printed circuit board, made of an insulating material and an electronic circuit (not shown) is fabricated on the surface of this board. The area corresponding to that part of the circuit designated as a shield requiring region 10 is indicated by hatching. In the conventional shielding method, the perimeter of the shield requiring region 10 is enclosed by a conductive pattern 12 formed on the surface of the circuit board 11. As schematically illustrated in the figure, the conductive pattern 12 is connected with ground point E via an appropriate current path.

A metallic box member 13 open at one side is constructed to have a height slightly greater than the maximum height of the electronic components mounted on the circuit board 11 and to have the shape of the edge defining the open side conform to the shape of the conductive pattern 12. The metallic box member 13 is set on the circuit board 11 with said edge resting on the conductive pattern 12.

Then, as shown in FIG. 2(B), the region bridging the line of contact between the lower edge of metallic box member 13 and the conductive pattern 12 is subjected to soldering 14 so as to electrically and mechanically fix the metallic box member 13 with respect to the conductive pattern 12 and thus obtain a fixed shield structure.

Alternatively, as shown in FIG. 3(A), the metallic box member 13 is provided along its lower edge with a number of tabs 15, and the metallic box member 13 is fixed on the circuit board 11 by screw-fixing means 18 constituted either of bolts 16 passed through holes in the tabs and the circuit board 11 and having nuts 17 screwed thereon or of the bolts 16 an tapped holes provided directly in the circuit board 11. In either case, the metallic box member 13 and the circuit board 11 are forced onto each other to obtain a mechanical fixing force therebetween, and, at the same time, the edge of the metallic box member 13 defining the open side thereof is pressed onto the conductive pattern 12 to esablish an electrical shield structure.

However, this conventional shield method has a major intrinsic defect.

In the method illustrated in FIGS. 2(A) and (B), a considerable amount of time and labor is required for providing the soldering 14 around the entire periphery of the lower edge of the metallic box member 13. The need to provide this soldering thus greatly interferes with production efficiency.

Moreover, the heat used for fusing the solder is apt to collect within the metallic box member 13 and may thermally damage the components of the circuit mounted on the shielded region 10.

In the screw fastening method illustrated in FIGS. 3(A) and (B), on the other hand, while the fastening operation can be carried out more efficiently than in the case of soldering, it is found that the method frequently results in incomplete shielding. More specifically, the metallic box member 13 is generally fabricated by punching or bending a thin steel or copper sheet so that the edge defining the open side thereof is not, as shown schematically in FIG. 3(C), absolutely flat when viewed microscopically. Moreover, while not illustrated in the figure, the circuit board 11 also has a slight warp and does not exhibit such a high degree of flatness. As a result, a gap 19 is apt to occur between the bottom edge of the metallic box member 13 and the conductive pattern 12.

Also, when the screw fastening is carried out using tabs provided at several places along the bottom of metallic box member 13, since the amount of fastening force is different between those portions directly fastened by the screws and the portions intervening between the screw-fastened portions, warping of the edge defining the opening of the metallic box member 13 is likely, whereby similar gaps 19 are likely to occur.

The presence of such gaps naturally has a degrading effect on shielding performance and the problem of incomplete shielding has been found to actually occur with the conventional structure.

OBJECT AND SUMMARY OF THE INVENTION

The object of this invention is to provide a shield structure for a circuit on a circuit board which overcomes the aforesaid defects of the conventional structures, and more particularly to such a structure which is capable of providing highly reliable shielding for electronic circuitry fabricated on a specific region of a circuit board and which can be provided with relative ease.

For attaining this purpose, the shield structure according to the present invention comprises a conductive box member open on one side and defining an inner space of a size sufficient to accommodate circuit components provided on the surface of a circuit board within a region theroef requiring shielding, a conductive pattern member formed on the surface of the circuit board to enclose the region requiring shielding, screw-fastening means for fastening the conductive box member and the circuit member together with a fastening force acting therebetween, and conductive rib means formed on the bottom of the edge of the conductive box member defining the open side thereof, the rib means being caused to bite into the conductive pattern member by the fastening force.

While the conductive pattern member may be simply one provided on the surface of the circuit board by patterning as in the conventional method, it may alternatively further include a conductive sheet provided over part or all of the surface of the conductive pattern member. If the conductive sheet is formed of a relatively soft material such as copper, conductive rubber or conductive plastic, the conductive rib means of this invention will be able to bite deeply therein when the circuit board and the box member are forced against each other at the time they are mechanically assembled by the screw-fastening means.

In the manner described, it is possible by means of a relatively simple structure and simple fabrication work to obtain a reliable shield for the region requiring shielding, and to improve the noise resistance characteristics with respect to various electronic and electrical equipment.

Moreover, it is possible to arrange for the conductive box member to be formed integrally with the housing for the device as a whole or with some other structural member of the device. In this case, the screws used for fixing the device housing or the housing and some other structural member can double as the screw-fastening means for clamping the conductive box member and the circuit board in pressure contact with each other, thus markedly improving the production efficiency of the final product.

Further, even better shielding performance can be realized by providing a shield structure according to this invention on both faces of the circuit board at positions corresponding to the region requiring shielding. In this case, a further improvement is possible by electrically connecting the conductive patterns formed on opposite faces of the circuit board through holes formed in the circuit board.

The above and other objects and features of the invention will become more apparent from the following detailed description with reference to the accompanying drawings.

BRIEF DESCRIPTION OF THE DRAWINGS

FIG. 1 is a block diagram of a radar detector as one example of a circuit requiring a shield structure.

DETAILED DESCRIPTION OF THE PREFERRED EMBODIMENTS

The basic structure of the shield according to the present invention will be described with reference to FIG. 4.

Figure 2A:
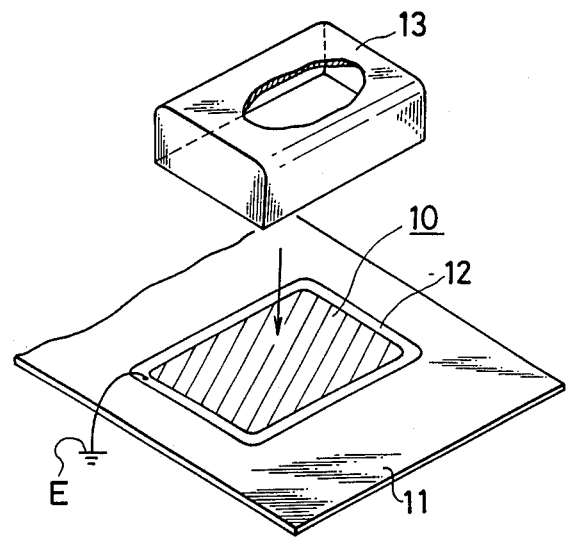
FIGS. 2(A) and (B) and FIGS. 3(A) and (B) are diagrams illustrating conventional shield structures.
Figure 2B:
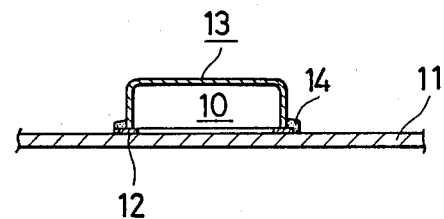
Figure 3A:
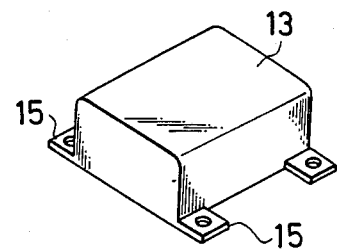
FIG. 3(C) is a diagram illustrating a disadvantage of the conventional structures shown in FIGS. 3(A) and (B).
Figure 3B:
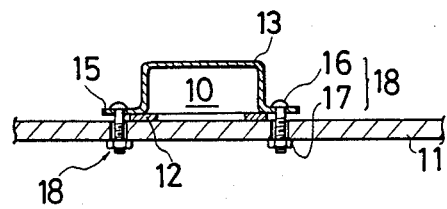
Figure 3C:
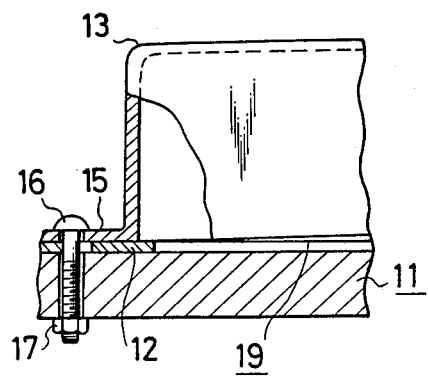
Figure 4:
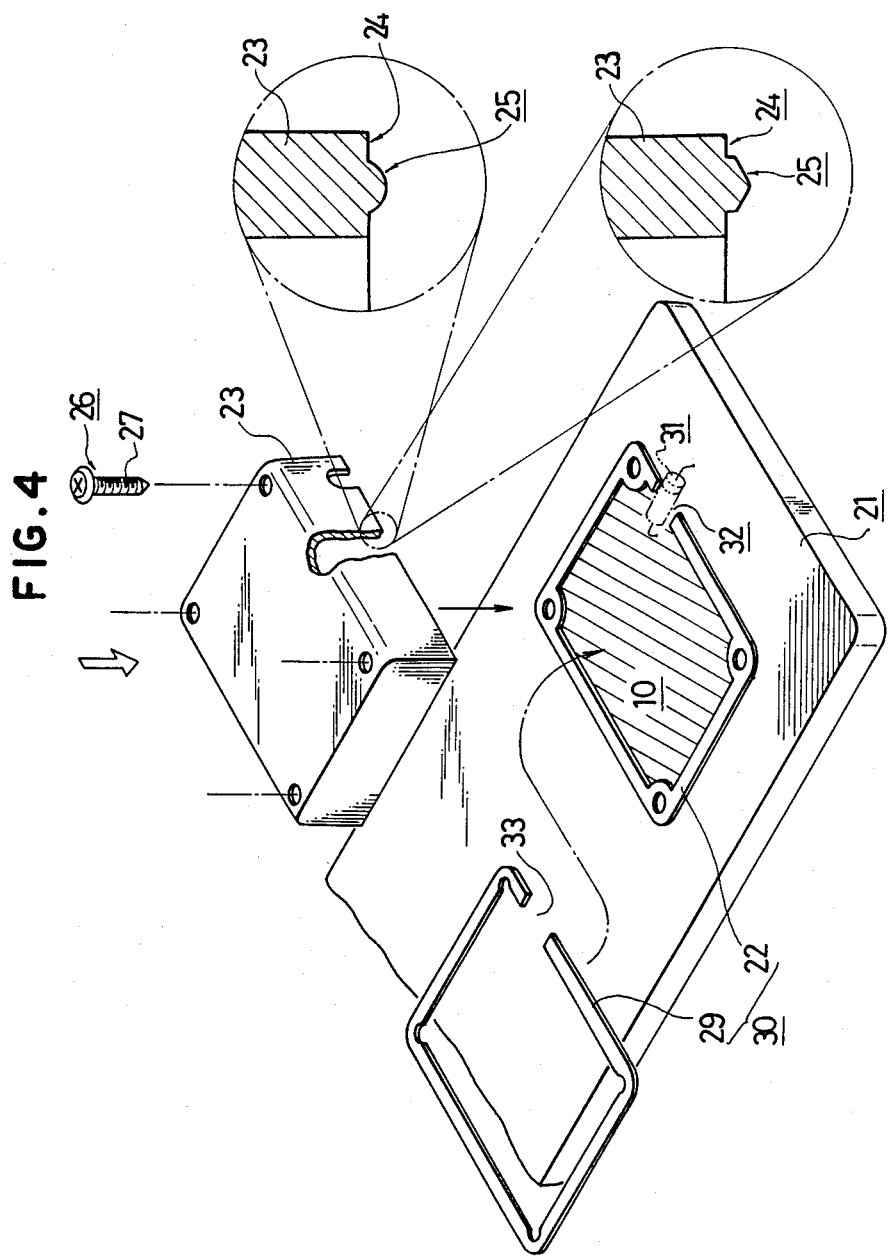
FIG. 4 is a perspective view illustrating a basic embodiment and the principle of the present invention.

The hatched region 10 in FIG. 4 indicates a region on the surface of a circuit board 21, e.g. a printed circuit board, which particularly requires shielding. While not shown in the drawing, the circuit board 21 has mounted thereon various active and passive electronic components interconnected so as to realize a circuit for performing a desired function.

In the illustrated case, nearly the entire perimeter of the region 10 is enclosed by a conductive pattern 22, the only exception being the part corresponding to a component 31 which, as indicated in phantom lines, extends between the shield-requiring region 10 and the region exterior thereto not requiring special shielding.

The conductive pattern 22 may be provided by procedures and operations like those used to print wiring patterns (not shown) on the circuit board 21 or may be provided by processing an appropriate conductive foil into the required configuration and then attaching it to enclose the shield-requiring region 10 on the surface of the circuit board 21.

While the entire perimeter of the shield-requiring region 10 should preferably be enclosed by the conductive pattern 22, it will sometimes be necessary to provide a break 32 in the pattern 22 in order to enable provision of a region-bridging component such as the component 31 shown in phantom lines.

FIG. 4 also shows a conductive sheet 29 made from copper foil, conductive rubber, conductive plastic or the like and having substantially the same shape as conductive pattern 22. The conductive pattern 22 and the conductive sheet 29 together constitute a conductive pattern member 30. It should be noted, however, that conductive sheet 29 is configured so as not to overlap holes provided for the passage of screw-fastening means 26 to be explained later, and that it has a cut-away portion 33 corresponding to the break 22 in the conductive pattern 22.

The conductive sheet 29 is placed on the conductive pattern 22 in close alignment therewith. If desired, the conductive sheet 29 can be provisionally attached to the conductive pattern 22 by use of a conductive bonding agent in advance of final assembly.

Alternatively, the conductive pattern member 30 may be constituted solely of the conductive pattern 22. Moreover, where the conductive sheet 29 is used, it need not be provided over the full length of the conductive pattern 22 but as will be seen in an embodiment to be described later, it may be attached over only a part thereof. In this case, the conductive pattern 22 and the conductive sheet 29 naturally have different shapes.

The embodiment of the invention shown in FIG. 4 further has a conductive box member 23 of a shape complementary to that of the planar configuration of the conductive pattern member 30. More specifically, the conductive box member 23 has an opening on one side and the profile of the edge 24 defining this opening is similar to or congruent with the planar configuration of the conductive pattern member 30. The conductive box member 23 encloses a space of sufficient height to accommodate therein the various components mounted within the shield-requiring region 10.

The conductive box member 23 may be formed of any material whatsoever insofar as it exhibits conductivity. Preferably, however, it is a product of aluminum die casting.

The edge 24 surrounding the opening in the conductive box member 23 is provided with a conductive rib means 25 projecting from the bottom thereof. Two examples of such a rib are shown in magnified sectional views in the insets in FIG. 4. In one example, the rib has a semicircular shape and constitutes a relatively blunt protuberance. In the other, the rib is wedge-shaped and constitutes a sharp point. Other sectional configurations are also of course possible.

One reason for stating that the conductive box member 23 should preferably be formed by aluminum die casting is that in the formation of the conductive rib means 25 on the edge 24 of the conductive box member 23, it is preferable, for reasons that will be elaborated later, that the conductive rib means 25 possess a certain degree of rigidity, and aluminum die casting to only enables an adequately rigid conductive rib means 25 to be obtained simply by forming the rib integrally with the conductive box member 23 at the time it is cast, but also provides a method of formation that is intrinsically simple.

Where the situation so requires, however, the conductive rib means 25 and the conductive box member 23 may be formed separately and then be fastened to each other by screws or other apprpriate fastening means.

The conductive box member 23 is fastened to the circuit board 21 by the screw-fastening means 26 so as to hold the two members in pressure contact with each other. In FIG. 4, one element of the screw-fastening means 26 is constituted by bolts 27 (only one shown) which are either screw-engaged with nuts 28 on the rear side of the circuit board 21 (see FIG. 5) or are constituted as taping screws or the like.

In the illustrated case, the conductive box member 23 and the circuit board 21 are provided with holes for the passage of the bolts 27 at points in alignment with the four corners of the shield-requiring region 10.

Figure 5:
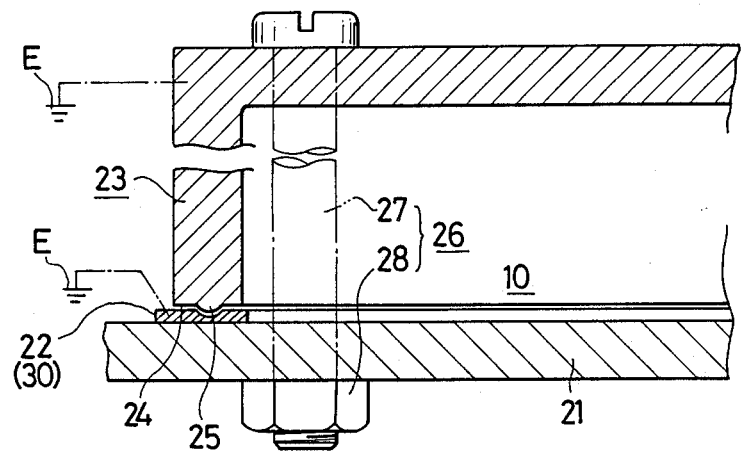
FIG. 5 and FIG. 6 are sectional views showing the assembled state of a main part of the basic embodiment of FIG. 4.

Therefore, when the screw-fastening means 26 is constituted of bolts 27 and the nuts 28 and these are used to fasten the conductive box member 23 onto the circuit board 21, the structure shown in FIG. 5 is realized.

As will be noted, the fastening force of the screw-fastening means 26 acts as a force generating means for maintaining the circuit board 21 and the conductive box member 23 in a mutually pressure contacted state, and the corresponding strain concentrates at the conductive rib means 25 provided on the edge 24 of the conductive box member 23. Therefore, as shown somewhat exaggeratedly in the figure, the conductive rib means 25 will, provided that as discussed earlier it is formed by aluminum die casting integrally with the conductive box member 23 so as to exhibit at least a prescribed degree of rigidity, bite into the conductive pattern member 30 enclosing the shield-requiring region 10 from the tip end thereof.

FIG. 5 relates to a case in which the aforesaid conductive sheet 29 is not used, i.e. to a case in which the conductive pattern member 30 is constituted solely by the conductive pattern 22. When the conductive sheet 29 is also used as one member constituting the conductive pattern member 30 as shown in FIG. 6, the biting force concentrated at the conductive rib means 25 causes the conductive rib means 25 to bite deeply into the relatively soft material of the conductive sheet 29.

As a result, even if the edge 24 surrounding the opening of the conductive box member 23 or the conductive pattern 22 should have less than perfect flatness, this deficiency will be compensated for and it will be possible to maintain the conductive box member 23 and the conductive pattern member 30 in good ohmic contact. Therefore, if either the conductive pattern member 30 or the conductive box member 23 is connected to an appropriate ground point E as indicated by a phantom line in FIG. 5, it will be possible to provide the circuit components housed within the conductive box member 23 with better electomagnetic shielding than has been possible heretofore.

It should be noted that the ground point E will not be referred to in connection with the embodiments described in the following. This is because in practical applications a ground line can be provided in various different ways. For example, it is possible to form a conductive passage to ground even without the provision of a special ground line by, for example, having the screw-fastening means 26 make electrical contact with the device housing (not shown).

Figure 6:
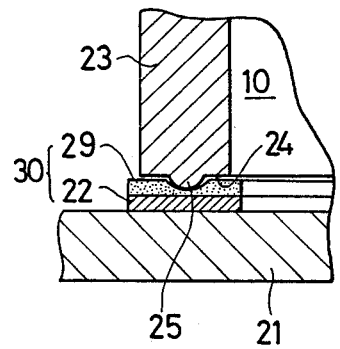

In the arrangements illustrated in FIGS. 5 and 6, however, there can be expected no substantial shielding effect to noise entering from the side of the circuit board 21 not provided with the conductive box member 23, i.e. from the rear side thereof.

The need for such shielding effect can, however, be met by providing one of the shield structures according to this invention on either side of the circuit board.

Figure 7:
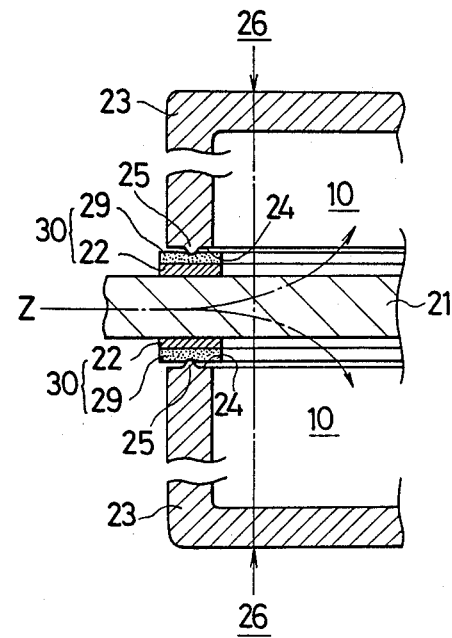
FIG. 7 is a sectional view of a main part of an embodiment wherein a shield structure according to the invention is provided on either surface of a circuit board.

FIG. 7 shows such an embodiment. This embodiment consists simply of two shield structures of the type shown in FIGS. 6 and 7 provided one on either side of the circuit board 21.

In this case, however, if the screw-fastening means 26 (shown schematically as arrows 26 indicating the resulting pressure contacting forces) are constituted so as to clamp the two conductive box members 23 toward each other with the circuit board 21 sandwiched therebetween, it becomes possible to rationalize the assembly process, to reduce the number of parts required and to automatically realize electrical connection.

However, even the two-sided seal structure shown in FIG. 7 may be insufficient in cases where an exceedingly high degree of electromagnetic shielding is required.

This is because, an indicated by the arrows Z in FIG. 7, there is in principle no barrier against electromagnetic noise entering through the circuit board 21 parallel to the surfaces thereof.

Figure 8:
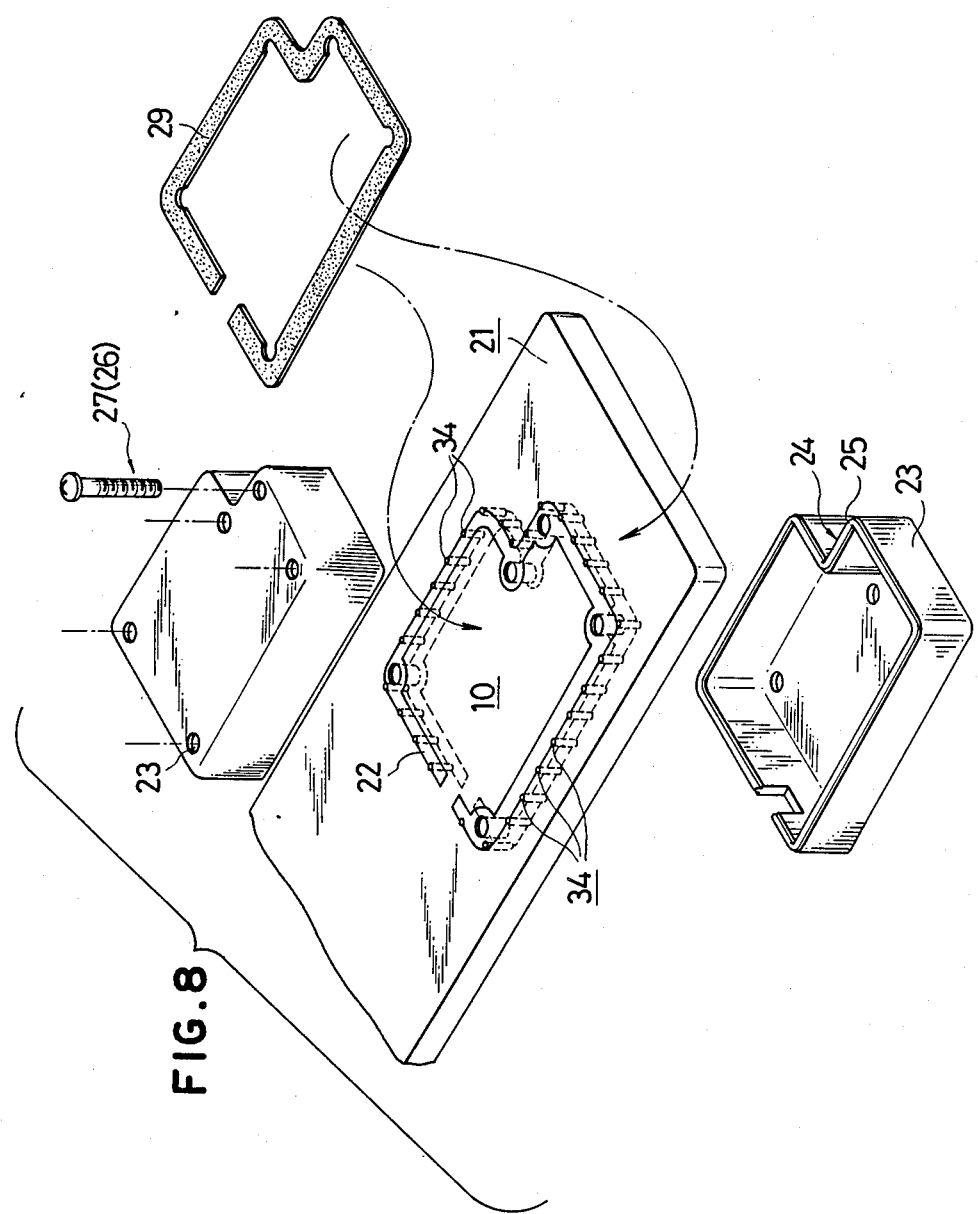
FIG. 8 is a perspective view schematically illustrating a second embodiment of the invention.
Figure 9:
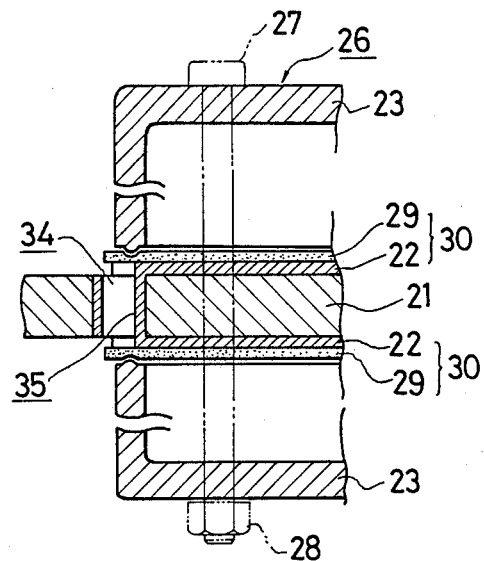
FIG. 9 is a sectional view showing the assembled state of a main part of the embodiment of FIG. 8.
Figure 10:
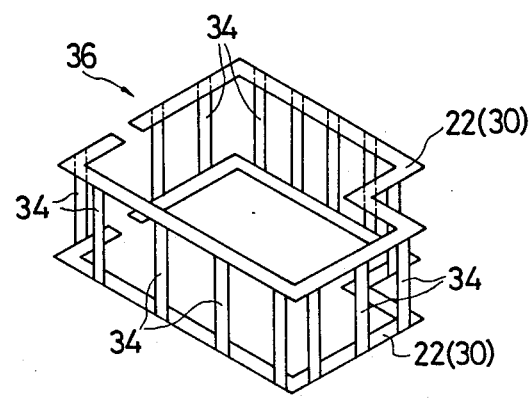
FIG. 10 is a perspective view of balustrade structure characterizing the embodiment of FIGS. 9 and 10.

For coping with this problem, it is possible to employ a structure as illustrated in FIGS. 8, 9 and 10.

In accordance with this structure the pair of conductive pattern members 30 or the pair of conductive patterns 22 provided one on either side of the circuit board 21 to enclose the shield-requiring regions 10 on opposite sides of the circuit board 21 are connected by conductive through-holes 34 provided in the circuit board 21 at appropriate intervals along these members.

In other aspects the structure may be the same as that in the embodiments described up to now. In this embodiment, when the conductive box members 23 are appropriately clamped toward each other by the screw-fastening means 26, the conductive rib means 25 on the edge 24 of each conductive box member 23 is brought into strong contact with the associated conductive pattern member 30 (which is shown to include the condutive sheet 29 in FIG. 9), similarly to the case of the earlier embodiments. With this arrangement, not only is it possible to realize adequate electromagnetic shielding of the shield-requiring regions 10 on the front and back surfaces of the circuit board 21, it is also possible, thanks to the presence of conductive linings 35 within the conductive through-holes 34, to realized electrical contact between the two conductive pattern members 30, while forming a balustrade 36 as illustrated schematically in FIG. 10.

FIG. 10 shows only the conductive portions as extracted from the remainder of the structure and, from this, it will be noted that the conductive linings 35 of the conductive through-holes 34 constitute balusters of the balustrade.

Thus, if the conductive through-holes 34 are disposed at not less than a predetermined density, it becomes possible to prevent or suppress the entry of electromagnetic waves into the shield-requiring region 10 through the material of the circuit board 21 parallel to the surfaces thereof.

Figure 11:
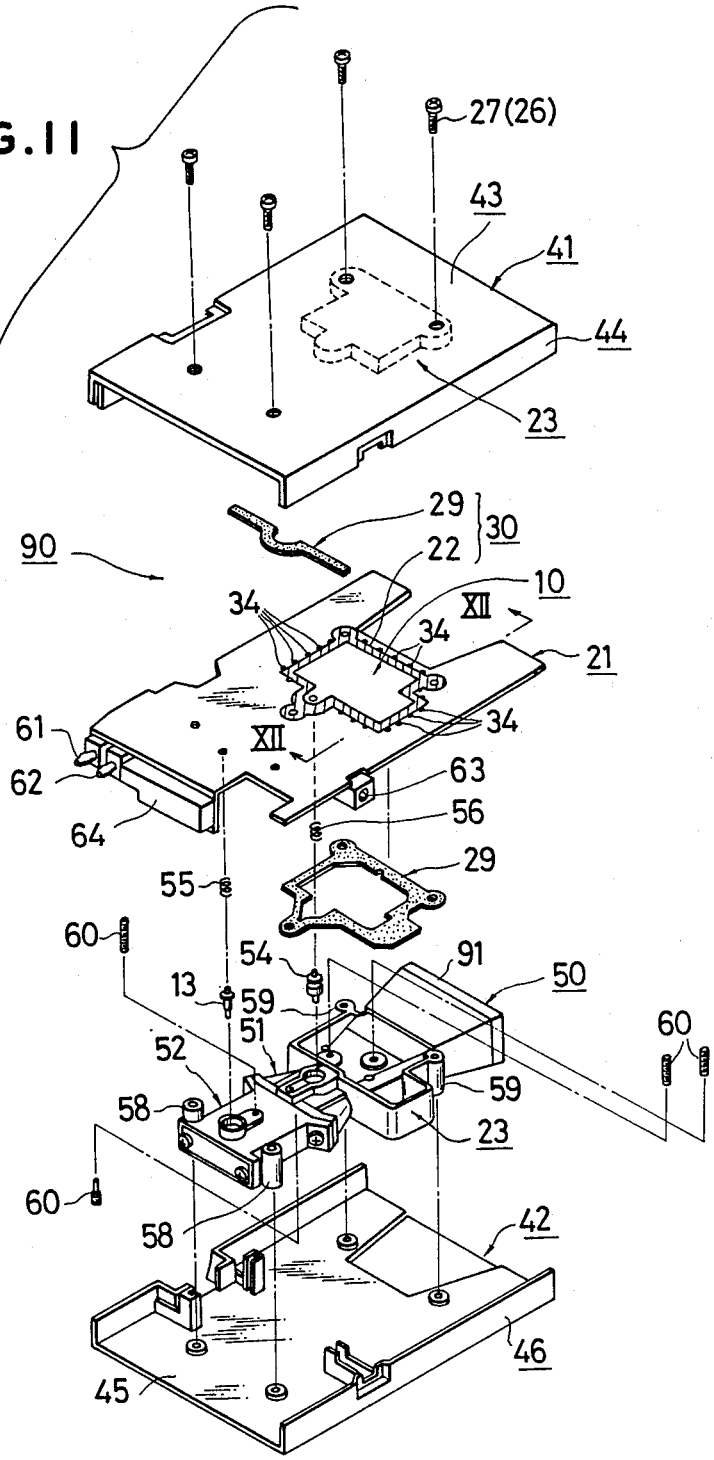
FIG. 11 is an exploded perspective view of a highly practical embodiment of the invention as applied to a radar detector.
Figure 12:
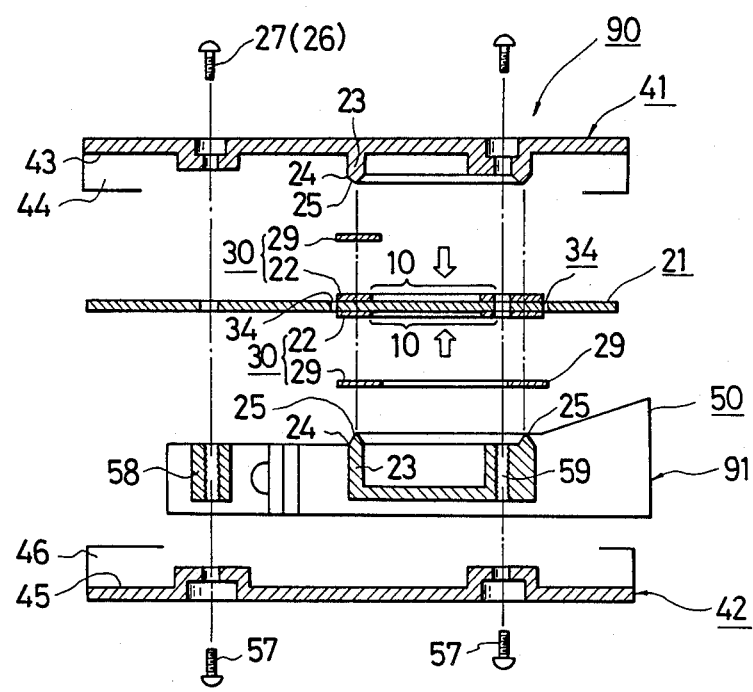
FIG. 12 is a sectional view taken along line XII—XII in FIG. 11.

FIGS. 11 and 12 illustrate a still more practical embodiment of the invention.

The device to which this embodiment is shown to be applied is the radar detector mentioned earlier in connection with FIG. 1.

Thus the block circuit diagram of the device can be presumed to be substantially identical with that shown in FIG. 1. The shield-requiring region 10 also corresponds to that of FIG. 1 and thus includes, for example, the first mixer 2, the first IF amplifier 4, the second mixer 5, the second local oscillator 6 and the like.

In FIGS. 11 and 12, the element to which the present invention is applied, i.e. the radar detector, is designated by the reference numeral 90.

The radar detector 90 has upper and lower housing halves produced by aluminum die casting. The upper housing half 41 has a roof 43 and upper half walls 44 (each constituting half of a side wall in the assembled state), and thus has a rectangular channel shape. The lower housing half 42 is constituted of a floor plate 45 and lower half walls 46 and has a similar rectangular channel shape.

As best shown in FIG. 12, which is a sectional view taken along line XII—XII in FIG. 11 for schematically representing the main portion of the structure, the upper housing half 41 has the conductive box member 23 according to this invention formed integrally on the inside surface thereof. On the other hand, the conductive box member 23 for the rear (lower) side of the circuit board 21 is in this embodiment formed integrally with a horn antenna member 50 as a depression of predetermined configuration in the upper surface thereof.

As in the earlier embodiments, the edges 24 enclosing the openings of the conductive box members 23 have protruding conductive rib means 25 of an appropriate predetermined shape formed by die casting integrally with the conductive box member 23. Thus they are formed integrally with the upper housing half 41 and with the horn antenna member 50, more particularly with the horn antenna 91 of the horn antenna member 50. This not only provides a sturdier structure but also makes it possible to realize high dimensional precision.

The horn antenna member 50 is constituted of the horn antenna 91 schematically illustrated in FIG. 1, a mixing chamber 51 positioned behind the horn antenna 91 for accommodating the first mixer 2 and a second chamber 52 which is fastened by screws to the rear of the mixing chamber 51 for accommodating a gun diode 53 serving as an oscillator element to which the frequency produced by the first local oscillator in the mixing chamber 51 is applied. The radar waves picked up by the horn antenna 91 are mixed with the oscillator frequency of the gun diode 53 in the mixing chamber 51, and a Schottky barrier diode (SBD) 54 is accommodated in the mixing chamber 51 for detecting the first intermediate frequency.

The horn antenna member 50 of the aforesaid structure is mounted on the circuit board 21. Surrounding the shield-requiring regions 10 on the front and rear sides of the circuit board 21, conductive patterns 22 are provided by means of the same patterning techniques used for forming the wiring patterns (not shown) on the circuit board 21. In the perspective view of FIG. 11 it is not possible to show the conductive pattern 22 surrounding the shield-requiring region 10 on the rear side of the circuit board. For this see FIG. 12.

In this embodiment too, the conductive pattern member 30 constituting one element of the present invention is constituted not only of the conductive pattern 22 but of the conductive pattern 22 plus the conductive sheet 29. A conductive sheet 29 is attached over the conductive pattern 22 on either side of the circuit board 21. In this case, the conductive sheet 29 for the front surface is not provided to cover all of the conductive pattern 22 but for reasons that will be explained later is applied to cover only a prescribed portion thereof.

The components described in the foregoing are assembled as follows.

After the horn antenna member 50 has been placed on the floor plate 45 of the lower housing half 42, screws 57 are screwed from beneath into tapped screw receiving members 58, 59 formed integrally with the horn antenna member 50, thus fixing the horn antenna member 50 on the lower housing half 42.

Following this, a first conductive sheet 29 destined to constitute one part of the conductive pattern member 30 on the upper side of the circuit board 21 is placed over the edge 24 surrounding the opening of the conductive box member 23 formed integrally with the so-mounted horn antenna member 50, i.e. is placed over the conductive rib means 25, the circuit board 21 is then set in place. The arrangement is of course such that the circuit board 21 can be positioned in proper alignment with various components to be referred to hereinafter. As a result, the conductive pattern 22 on the rear surface of the circuit board 21 comes into face-to-face abutment with the conductive sheet 29 on the rear side.

The conductive sheet 29 for the front side is then set over a prescribed portion of the conductive pattern 22 provided beforehand on the front surface of the circuit board 21 by patterning techniques, the upper housing half 41 is then set in place.

The upper housing half 41 has holes alignable with the screw receiving members 58 used earlier for fastening the horn antenna member 50 to the lower housing half 42, and screws or bolts 27 can be passed through these holes and screwed into the screw receiving members 58.

As similar bolt insertion holes are provided at corresponding positions of the circuit board 21 and the conductive sheet 29 on the rear side, the upper housing half 41 can be fixed on the horn antenna member 50 by screwing the bolts 27 down through the aligned holes from the upper side of the roof 43 of the upper housing half 41. As a result, the upper and lower housing halves 41, 42 are closed onto each other.

This completes the assembly of the radar detector 90. In the assembled state, the circuit board 21 can be clamped between the conductive box member 23 formed integrally with the upper housing half 41 and the conductive box member 23 formed integrally with the horn antenna member 50 by the upward and downward fastening forces acting to maintain the housing in its assembled state. Therefore, the conductive rib means 25 formed on the edges 24 surrounding the openings of the conductive box members 23 bite into the associated conductive sheets 29 and the conductive patterns 22 formed on the surfaces of the circuit board, thus establishing strong mechanical and electrical contact.

Thus, as with the embodiments describe earlier, it is possible to obtain the desired electromagnetic shield structure with respect to the shield-requiring region 10.

For the purpose of effectively shutting out interference waves entering through the material of the circuit board 21 in parallel with the surfaces thereof, it is most preferable to dispose conductive through-holes 34 in the respective conductive patterns 22 and to establish electrical connection between the two conductive patterns 22 through these holes, similarly to what was explained in connection with FIGS. 8, 9 and 10.

What characterizes this embodiment is that the screw means used for assembly of the radar detector also serve as the screw-fastening means 26 (in the illustrated case, the bolts 27 and the screw receiving members 58, 59) for realizing the electromagnetic shield structure according to this invention.

Stated differently, since the conductive box members 23 are constituted in advance of one part formed integrally with the upper housing half 41 and another part formed integrally with the horn antenna member 50, the fastening of these two members together automatically results in a pair of conductive box members 23 being clamped together.

As a result, the number of components required is greatly reduced and, moreover, the final product can be made compact, which is a highly important factor in this type of radar detector.

For example, if the upper housing half 41 and the conductive box member 23 should be formed as separate members, the thickness of the radar detector would be increased by at least the thickness of the roof of the upper housing half plus the thickness of the roof of the conductive box member 23. In the present embodiment, however, since the two are integrally formed, the thickness of the radar detector is increased only by the thickness of the roof of the upper housing half.

However, when the pair of conductive box members 23 are indirectly clamped together by fastening together upper and lower housing halves as described in the foregoing, even though it may be possible to provide the pair of screw receiving members 59 integral with the horn antenna member 50 at locations very near the shield-requiring region 10, it may become necessary for reasons related to balanced fastening of the housing, to provide the other screw receiving members 58 at locations which are fairly distant from the shield-requiring region 10. This is in fact precisely the case in the embodiment illustrated in FIGS. 11 and 12.

Therefore, when the screw-fastening means 26 used in this invention also double as the assembly bolts 27 as described in the foregoing, even if all of the bolts are tightened to the same degree, some difference will still arise between the force with which the screw-fastening means 26 screwed into the screw receiving members 59 located near the shield-requiring region 10 will cause the conductive rib means 25 of the conductive box member 23 to bite into the conductive pattern member 30 and the force with which the screw-fastening means 26 screwed into the screw receiving members 58 located far from the conductive rib means 25 will cause the conductive rib means 25 to bite into conductive pattern member 30. Namely, the force generated by the more distant screws will be smaller.

As was explained earlier, on the front side of the circuit board 21 the conductive sheet 29 constituting one element of the conductive pattern member 30 does not cover the full length of the conductive pattern 22 but covers only one part thereof, specifically only the part in the vicinity of the screw receiving members 58, as shown in the drawing. This arrangement is employed in order to prevent differences in the state of electrical connection that by reason of the aforesaid force relationship would otherwise occur as a result of warping of the circuit board or depending on the circumferential position of the conductive rib on the conductive box member or of the conductive pattern member.

Experiments conducted by the inventor show that in actual practice the electromagnetic shield effect obtained is much better in a radar detector employing the illustrated arrangement than in one in which the conductive sheet 29 is provided over the full length of the conductive pattern 22.

It should also be noted that this embodiment teaches that the conductive box member and the circuit board of this invention need not directly receive clamping force from the screw-fastening means but can be arranged to receive clamping pressure from the screw-fastening means indirectly.

Therefore in special cases the invention can be realized by simply sandwiching the conductive box member and the circuit board between two members capable of being clamped onto each other by screw-fastening means, so as to be held therebetween merely by the force of friction.

While the foregoing has been limited mainly to a detailed description of embodiments of the invention, the remaining structural elements of the radar detector 90 shown in FIGS. 11 and 12 will now be briefly explained.

As was mentioned earlier, the horn antenna member 50 of the illustrated radar detector has a horn antenna 91 to the rear of which there is integrally formed a mixing chamber 51 which accommodates an SBD 54. Further, a second chamber 52 accommodating a gun diode 53 is fastened to the rear of the mixing chamber 51 by means of screws.

With this arrangement, in order to ensure that the gun diode 53 and the SBD 54 will be positionally stable upon accommodation within the respective chambers 52 and 51 and to ensure that they will make reliable electrical contact with the wire patterns (not shown) provided for them on the circuit board, it is preferable for compression springs 55, 56 made of conductive material and capable of functioning as electrical contacts to be disposed between the rear side of the circuit board 21 and flange-shaped portions of the respective diodes 53, 54.

Conventionally, this part of the device has been realized by, for example, making U-shaped cut-outs in the circuit board 21, positioning one end of each of the diodes 53, 54 in one of the cut-outs and using these U-shaped portions as leaf springs for urging the diodes downward and positioning them within the respective chambers 52, 51. This method has, however, led to such troubles as warping of the circuit board 21 and imperfect electrical contact. In contrast, when the aforesaid springs were used, it was found that these problems were completely overcome.

Projecting screw means 60 for matching adjustment are also generally accommodated within the chambers 51, 52.

In FIG. 11, two toggle switches 61 and 62 are shown at the rear of the housing portion. The switch 61 is a warning mode switch for selecting which of three types of warnings will be issued upon detection of a radar wave: a visible warning employing a light-emitting means such as a light-emitting diode disposed in a warning section 64, an audible warning employing a sound producing means such as a speaker, or a visible and audible warning employing both of the foregoing. The switch 62 is for selecting the sensitivity. In addition, a volume control 63 is provided on the side of the housing for enabling adjustment of the level of the audible warning.

What is claimed is:

1. A shield structure for a circuit said shield structure mounted on a circuit board, comprising:
    a first conductive pattern member formed on a top surface and a second conductive pattern member formed on a bottom surface of said circuit board, said first conductive pattern member being formed along a shield-requiring region on the top surface of said circuit board and said second conductive pattern member being formed along a shield-requiring region on the bottom surface of said circuit board;
    a first conductive box member having an open side and defining a shielded space enclosing said shield-requiring region on the top surface of said circuit board; and a second conductive box member having an open side and defining a shielded space enclosing said shield-requiring region on the bottom surface of said circuit board;
    a first conductive rib means formed on an edge defining the open side of said first conductive box member, said first conductive rib means connecting to said first conductive pattern member, a second conductive rib means formed on an edge defining the open side of said second conductive box member, said second conductive rib means connecting to said second conductive pattern member;
    screw-fastening means for securing said first conductive box member and said second conductive box member in pressure contact with said circuit board and for causing said first conductive rib means to bite into said first conductive pattern member and for causing said second conductive rib means to bite into said second conductive pattern member; and,
    conductive through-holes, provided with conductive linings, formed on the top surface and bottom surface of said circuit board, said conductive linings electrically connecting said first conductive pattern member and said second conductive pattern member.

* * * * *